United States Patent [19]
Ueno et al.

[11] Patent Number: 5,723,894
[45] Date of Patent: Mar. 3, 1998

[54] STRUCTURE FOR PROVIDING AN ELECTRICAL CONNECTION BETWEEN CIRCUIT MEMBERS

[75] Inventors: Toshiaki Ueno, Yokohama; Mitsuchika Saito, Kawasaki, both of Japan

[73] Assignee: Hewlett-Packard Company, Palo Alto, Calif.

[21] Appl. No.: 675,768

[22] Filed: Jul. 3, 1996

[30] Foreign Application Priority Data

Jul. 7, 1995 [JP] Japan .................................. 7-196175

[51] Int. Cl.⁶ .................................................. H01L 29/82
[52] U.S. Cl. ........................... 257/415; 257/418; 257/420; 257/692
[58] Field of Search ............................... 257/777, 420, 257/418, 415, 692, 774, 780

[56] References Cited

U.S. PATENT DOCUMENTS 5,536,963  7/1996  Polla ........................................ 257/420
5,602,422  2/1997  Schueller et al. ........................ 257/774

OTHER PUBLICATIONS

G. Messner, et al., "Thin Film Multichip Modules", ISHM., 1992, pp. 363–393.

C. Boyko et al., "Film Redistribution Layer Technology", ICEMM Proceedings '93, 1993, pp. 196–199.

E. Hatanaka et al., "Multi Chip Module Vol. 2–A Product Design and Low Cost MCM Technology in a Multi–Media Era", 1st. edition, Tokyo: Science Forum, Ltd., 1994, pp. 62–70.

"Basic Seminar on the Electronics Packaging Technology Vol. 1 General Discussion", Ed. Hybrid Micro–Electronics Association, 1st. Edition, Tokyo:#Kogyou Chosa Kai Ltd., 1994, pp. 188–239.

*Primary Examiner*—Tom Thomas
*Assistant Examiner*—Roy Potter

[57] ABSTRACT

An electrical connection structure interconnects a first circuit member and a second circuit member and comprises a cantilever, a conductive needle, a terminal pad and a fixing element. The cantilever is formed in the semiconductor substrate and has an end remote from the semiconductor substrate. The conductive needle is at the end of the cantilever and is electrically connected to the first circuit member. The terminal pad is located on the second circuit member opposite the conductive needle tip when the first circuit member and the second circuit member are juxtaposed. The terminal pad is electrically connected to the second circuit member. The fixing element fixes the first circuit member juxtaposed to the second circuit member in a way that stresses the cantilever to apply a contact force between the conductive needle and the terminal pad.

20 Claims, 5 Drawing Sheets

STRUCTURE FOR PROVIDING AN ELECTRICAL CONNECTION BETWEEN CIRCUIT MEMBERS

FIELD OF THE INVENTION

The present invention relates to electronic circuits, and, in particular to a structure for making electrical connections between one circuit member and another.

BACKGROUND OF THE INVENTION

Recent progress in semiconductor technology has significantly increased the degree of integration that can be achieved, and has also increased the number of input/output (I/O) connections on each integrated circuit. Recently, multichip modules ("MCM"), in which multiple semiconductor chips are mounted on a single circuit substrate, have been developed. MCMs increase mounting density, reduce circuit size, shorten the length of interconnections, and accelerate circuit operation.

As shown in FIG. 1, multiple semiconductor chips 91 are usually mounted on the circuit substrate 92. The circuit substrate includes a layer of ceramic or silicon and has multi-layer wiring. Particularly, when there are many I/O connections, solder bumps 93 are used provide the electrical connections between the circuit substrate and the semiconductor chips, and also to attach the semiconductor chips physically to the circuit substrate. The solder bumps are minute balls of solder.

MCMs are usually electrically tested after the semiconductor chips 91 have been mounted on the circuit substrate 92. The electrical tests check for bad contacts between the circuit substrate and the semiconductor chips, and for bad semiconductor chips. The MCMs that pass the test are hermetically sealed with the cap 94, for example.

Various signals (data signals, power source signals, ground potential signals, for example) pass between the circuit substrate 92 and the printed circuit (not shown) via the pins 95. (See: *Thin Film Multichip Module*, INTERNATIONAL SOCIETY FOR HYBRID MICROELECTRONICS, 1992, pp. 363–90.)

FIG. 2 shows a conventional connection structure using a solder bump in more detail. The solder bump 93 connecting the semiconductor chip 91 to the circuit substrate 92 is conventionally pre-formed on the terminal pad 96 of the semiconductor chip or on the terminal pad 97 on the circuit substrate. Then, assuming that the solder bump 93 is pre-formed on the terminal pad 96 on the semiconductor chip, for example, the semiconductor chip is manipulated to put the solder bump in contact with the terminal pad 97 on the circuit substrate, and the solder bump is heated. The solder bump melts and forms the conventional connection structure shown in FIG. 7.

MCMs having the above-described conventional connection structure have several structural shortcomings, and are difficult to test.

(1) To form the conventional connection structure, solder bumps 93 must be pre-formed with a uniform size on the terminal pad 96 of the semiconductor chip 91 or on the terminal pad 97 of the circuit substrate 92. This requires special processing and equipment.

(2) In MCMs, when the semiconductor chips 91 are mounted on the circuit substrate 92 by so-called flip-chip mounting, the surface of the semiconductor chips on which the lead pattern and bonding pads are located normally faces the circuit substrate. This makes it difficult to perform electrical tests to determine whether the solder connections are good after melting the solder bumps 93. This also makes it difficult to determine whether the semiconductor chips 91 are operating properly. Furthermore, even when bad solder connections are detected by testing, it is difficult to repair specific bad connections.

(3) The solder bumps 93 not only connect the semiconductor chips 91 to the circuit substrate 92 electrically, they also strongly attach the semiconductor chips mechanically. When the thermal expansion coefficients of the semiconductor chip 91 and the circuit substrate 92 differ, stress develops in the solder bumps 93 connecting the semiconductor chip to the circuit substrate, and the integrity of the mechanical and electrical connections may deteriorate due to mechanical stress induced by temperature changes that occur during subsequent manufacturing operations or in service.

(4) If tests of the MCM indicate a poor electrical connection in a specific semiconductor chip 91, replacement of the defective chip is difficult because it requires that the bonds between the bad semiconductor chip and the circuit substrate 92 be heated to re-melt the solder bumps.

In view of the above problems of known connection structures, a new connection structure capable of connecting a first circuit member, for example, a semiconductor chip, to a second circuit member, such as a circuit substrate, without using solder is desirable. The new connection structure should preferably allow bad circuits to be replaced easily.

SUMMARY OF THE INVENTION

The present invention provides an electrical connection structure for connecting a first circuit member to a second circuit member. The first circuit member includes a semiconductor substrate. The electrical connection structure comprises a cantilever, a conductive needle, a terminal pad and a fixing element. The cantilever is formed in the semiconductor substrate and has an end remote from the semiconductor substrate. The conductive needle is at the end of the cantilever and is electrically connected to the first circuit member. The terminal pad is located on the second circuit member opposite the conductive needle tip when the first circuit member and the second circuit member are juxtaposed. The terminal pad is electrically connected to the second circuit member. The fixing element fixes the first circuit member juxtaposed to the second circuit member in a way that stresses the cantilever to apply a contact force between the conductive needle and the terminal pad.

In the present invention, the term "circuit member" encompasses such components as a silicon substrate, a circuit substrate, a circuit board, a semiconductor chip, a resistor, and a capacitor. Additionally, in the present invention, a reference to a first circuit member being connected to a second circuit member encompasses plural first circuit members, such as semiconductor chips being connected to one second circuit member, such as a circuit substrate, as in an MCM.

To simplifY the description of the invention, the circuit member on which the cantilever is formed will be called the "first circuit member," and the circuit member on which the terminal pad is formed will be called the "second circuit member." However, some types of circuit members may have both a cantilever and a terminal pad formed on them.

In some applications, dirt may adhere to the cantilever contact, or the tip of the conductive needle may wear. To make it easier to replace components in such applications, when plural first circuit members are connected to one second circuit member as in an MCM, or when a semiconductor chip is connected to a circuit board, the cantilever may be formed on the semiconductor chip. In this case, the semiconductor chip would be the first circuit member.

The cantilever can be formed from a material, such as silicon, having a suitable elastic properties to obtain a good electrical contact between the conductive needle and the terminal pad. Therefore, the substrate of the first circuit member in which the cantilever is formed is preferably single-crystal silicon.

The electrical connection structure can additionally comprise an electrostatic drive electrode that bends the cantilever in response to an applied voltage. The electrostatic drive electrode is mounted on the cantilever and on either or both of the circuit members.

The electrical connection structure may additionally include a control element that varies the magnitude of the voltage applied to the electrostatic drive electrode to change the pressure between the conductive needle and the contact terminal surface. When the circuit members are connected by multiple electrical connection structure, this enables variations in the contact pressure at each electrical connection structure to be reduced or eliminated. The control element may also set the applied voltage to one that bends the cantilever to an extent that breaks contact between the conductive needle and the terminal pad. This enables a test signal to be disconnected from the circuit without using an external switch, for example.

The electrical connection structure may additionally include multiple conductive needles in contact the terminal pad. The multiple conductive needles may be located at the end of one or more cantilevers. In this case, the current flowing through the one terminal pad is flows through multiple conductive needles, which avoids damage caused by an excessive current flowing through one conductive needle.

The electrical connection structure may additionally include a positioning element that defines the relative positioning of the circuit members, at least in a direction perpendicular to the substrate of the first circuit member. The positioning element typically comprises bumps or recesses formed on one or both of the circuit members. The bumps or recesses can also be used to locate one of the circuit members relative to the other circuit member in the direction parallel to the substrate of the first circuit member.

Furthermore, fixing element may temporarily fix the first circuit member juxtaposed to the second circuit member to allow the first circuit member to be removed from and re-installed in the second circuit member. For example, using the electrical connection structure of the present invention in an MCM enables bad semiconductor chips detected in the fabrication process to be replaced. That is, in the course of fabricating the MCM, the electrical characteristics can be tested after all the semiconductor chips have been temporarily attached to the circuit substrate. Then, bad semiconductor chips can be easily replaced. After the operation of the entire module is verified, the semiconductor chips can be permanently attached to the circuit substrate by an adhesive. Therefore, the electrical connection structure of the present invention not only provides the ability to replace bad semiconductor chips easily, but also markedly reduces the costs related to testing and fabrication.

In the electrical connection structure according to present invention, pressure applied between the first circuit member and the second circuit moves the conductive needle at the tip of the cantilever formed in first circuit member into contact with the terminal pad formed in the second circuit member. This establishes an electrical connection between the circuit members without the use of heat. The electrical connection structure of the present invention is therefore ideal for connecting semiconductor devices, for example, CCD imaging devices, that cannot tolerate high temperatures.

Since solder bumps not only provide an electrical connection, but also provide a strong mechanical bond between the circuit members, conventional electrical connections made using solder bumps require that the thermal expansion coefficients of both circuit members be closely matched to lower the mechanical stress that arises as the temperature changes. This imposes limitations on the choice of materials that may be used to make the circuit members. In the present invention, when the circuit members are fixed to one another by an adhesive, even if temperature changes cause small amounts of relative motion between the circuit members, the conductive needle will slide across the surface of the terminal pad and maintain contact. Thus, the electrical connection structure of the present invention does not require that the thermal expansion coefficients of the circuit members match. Therefore, the present invention can be widely applied to circuit members with different thermal expansion coefficients and can improve the reliability of the electrical connections between them.

The conductive needle being able to slide over the surface of the terminal pad provides important advantages, since it enables contact to be maintained even in applications in which the substrate and the semiconductor chip can move relative to each other.

The cantilever is preferably formed using silicon micromachining. Similar to the semiconductor processing that forms conventional semiconductor circuit elements, silicon micromachining enables multiple mechanical parts, such as cantilevers, having dimensions in the range of several tens of microns, to be individually formed on the same silicon substrate. Therefore, the electrical connection structure according to the invention will provide convenient, reliable electrical connections even if the number of I/O connections in the semiconductor chips increases, or finer terminal pads with narrower pitches are used in future.

BRIEF DESCRIPTION OF THE DRAWINGS

FIG. 3A is an enlarged perspective view of part the semiconductor chip.

FIG. 3B is an enlarged perspective view of part of the circuit substrate.

FIG. 3C is an enlarged cross sectional view showing the part of the semiconductor chip and part of the circuit substrate after the semiconductor chip and the circuit substrate have been integrated into one unit.

DETAILED DESCRIPTION OF THE INVENTION

Embodiments of the present invention will now be described with reference to the drawings.

Figure 1:
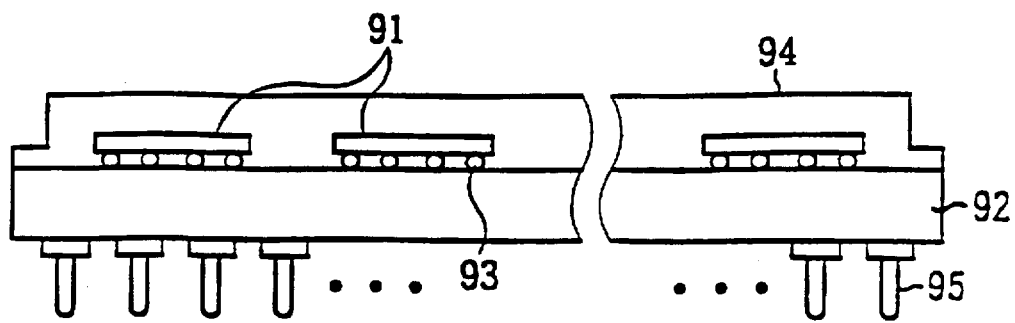
FIG. 1 is a cross sectional view showing a semiconductor chip connected to a substrate a conventional MCM.
Figure 2:
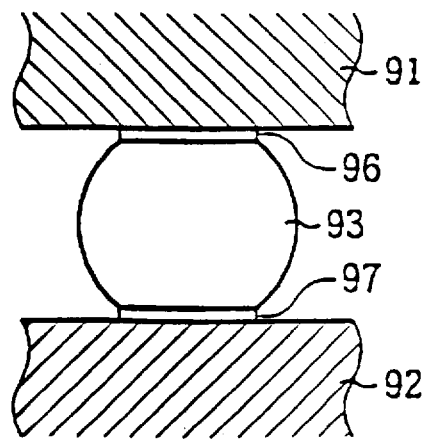
FIG. 2 shows a conventional electrical connection structure using solder bumps.
Figure 3A:
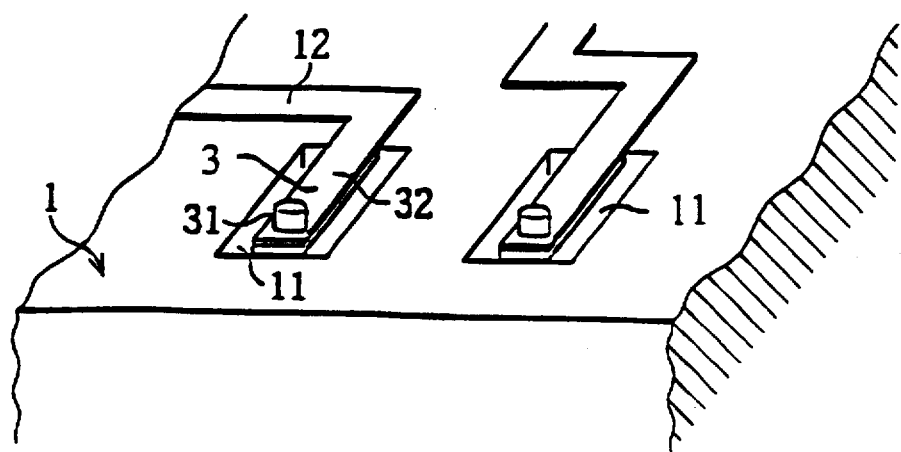
FIGS. 3A–3C show a first embodiment of the electrical connection structure according to the present invention.
Figure 3B:
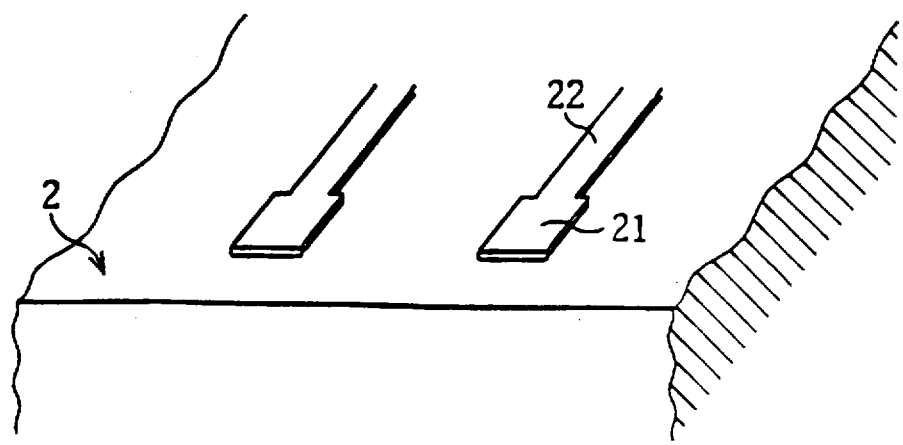
Figure 3C:
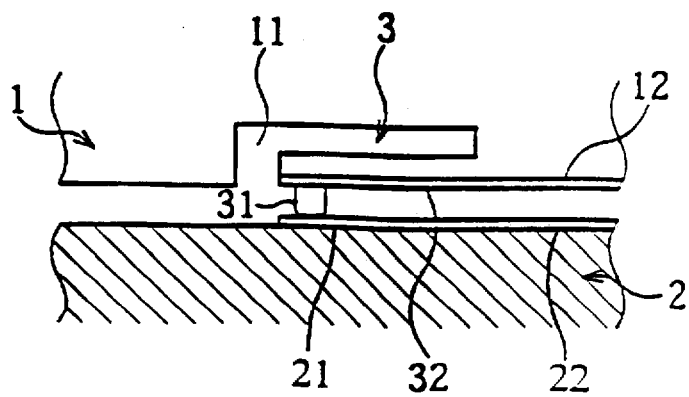

FIGS. 3A–3C show a first embodiment of the present invention. In this embodiment, the first circuit member indicates the semiconductor chip 1 and the second circuit member indicates the circuit substrate 2.

As shown in FIGS. 3A and 3C, the trenches 11 are formed in the semiconductor chip 1. A cantilever 3 is formed in each trench. A conductive needle 31 is formed at the tip of each cantilever 3. The conductive needle will make contact with the circuit substrate 2. The track 32 formed one surface of the cantilever connects the conductive needle 31 to the signal line 12 that runs on the surface of the semiconductor chip, and is connected to the electronic circuit formed elsewhere in the semiconductor chip.

The cantilever 3 is elastic in the direction perpendicular to the surface of the semiconductor chip. In this embodiment, the material of the substrate of the semiconductor chip 1 is single-crystal silicon, and the cantilever is formed in the material of the substrate. Consequently, the cantilever is also formed from single-crystal silicon. Since single-crystal silicon has excellent elastic properties, the spring constant of the cantilever can be set to the desired value by choosing the length, thickness, and width of the cantilever. This enables the contact force that acts between the conductive needle 31 and the terminal pad 21, which will be described later, to be set to any value. The cantilever is preferably formed in the substrate of the semiconductor chip by micromachining.

As shown in FIGS. 3B and 3C, the above-mentioned terminal pad 21 is formed on the part of the surface of the circuit substrate 2 that lies opposite the conductive needle 31 when the semiconductor chip 1 and the circuit substrate are juxtaposed. The terminal pad is connected to the signal line 22 of the circuit substrate.

The preferred materials for the conductive needle 31 and the terminal pad 21 are metals that are difficult to oxidize, such as gold or platinum. Using an oxidation-resistant metal prevents an insulating oxide layer being formed on the surfaces of the conductive needle and the terminal pad. Such an oxide layer could cause poor contact integrity and/or an increase in contact resistance.

As shown in FIG. 3C, the conductive needle 31 is formed so that juxtaposing the semiconductor chip 1 and the circuit substrate bends the cantilever 3. This causes the cantilever to exert a contact pressure between the tip of the conductive needle and the terminal pad 21 on the circuit substrate, and forms an excellent electrical connection between the signal line 22 on the circuit substrate and the signal line 12 on the semiconductor chip. This connection is provided via the track 32 and the terminal pad.

In the embodiment illustrated in FIGS. 3A–3C, the cantilever 3 is formed in the single-crystal silicon substrate of the semiconductor chip 1. However, the circuit substrate 2 can also be formed from single-crystal silicon. In this case, the cantilever may be formed in the single-crystal silicon of the circuit substrate, and the terminal pad contacted by the conductive needle attached to the cantilever may be formed on the semiconductor chip 1. This arrangement provides an electrical connection structure similar to the electrical connection structure described above with reference to FIGS. 3A–3C.

The cantilever 3 shown in FIGS. 3A–3C may be similar to the very small cantilevers having a conductive needle at their remote end that are used in such technologies as in scanning tunneling microscopes (STM) and scanning atomic force microscopes (AFM). Using silicon micromachining to make the cantilever 3 enables multiple cantilevers less than 100 µm wide to be made simultaneously in a single silicon substrate with a uniform pitch of less than several tens of microns. The terminal pads used in currently-marketed LSIs are about 100 µm square and have a pitch of about 200 µm. Thus, the electrical connection structure of the present invention can be used for connecting to LSIs that have a higher density of I/O connections than those currently marketed.

The conventional technology using solder bumps with diameters of several tens of microns can create poor connections if there are variations in the diameters of the solder bumps. However, in the electrical connection structure of the present invention, variations in the height of the conductive needle 31 or in the shape of the cantilever 3 are absorbed by the elasticity of the cantilever 3, so poor connections are prevented.

Figure 4:
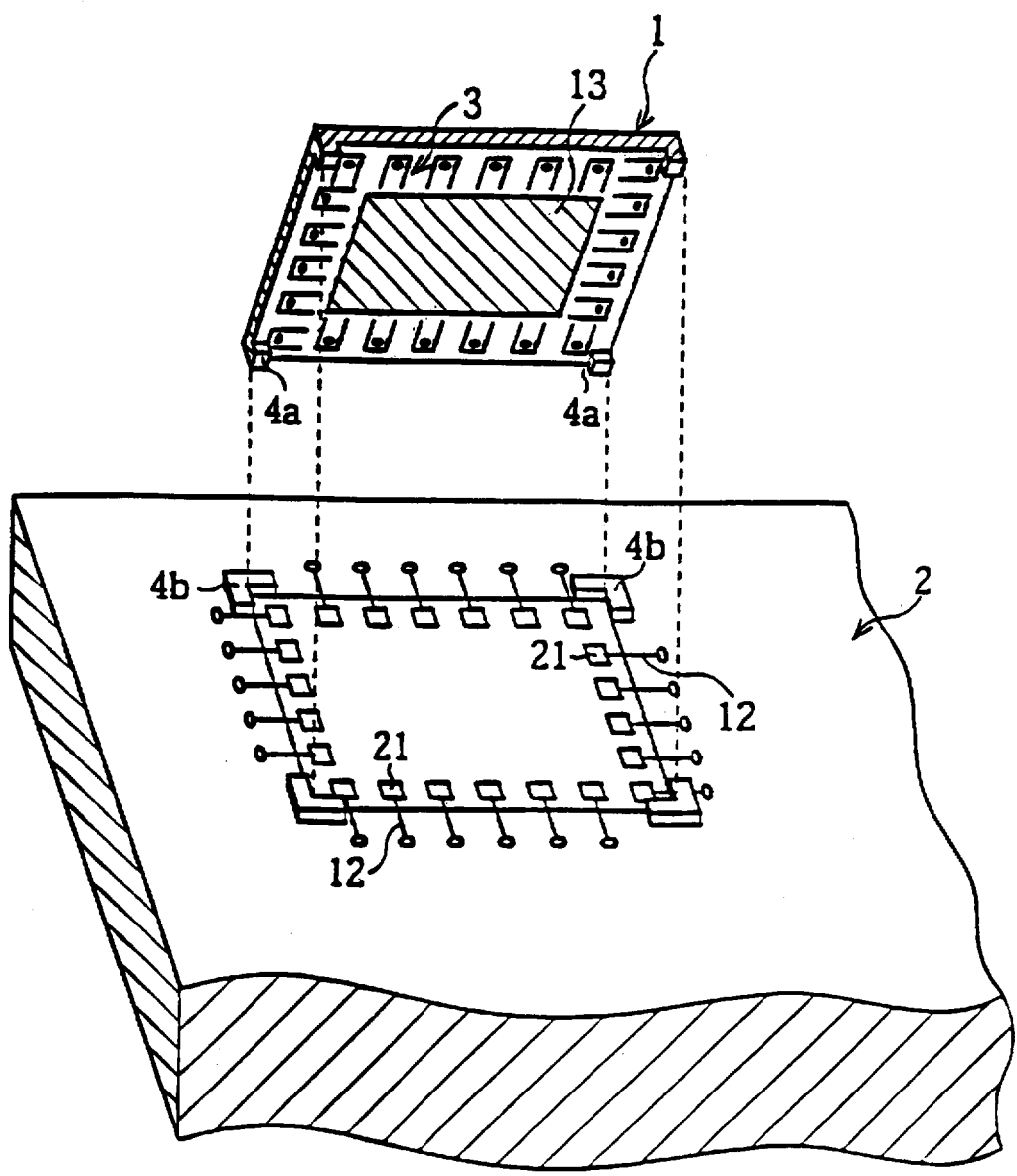
FIG. 4 is an enlarged exploded perspective view showing an example of the electrical connection structure according to the present invention used to provide multiple connections between a semiconductor chip and a circuit substrate.

FIG. 4 shows a more specific example of the electrical connection structure shown in FIGS. 3A–3C. In this embodiment, the electronic circuit 13 is formed in the same surface of the semiconductor chip 1 as that on which the cantilevers 3 are formed. Also formed on this surface of the semiconductor chip are the positioning elements 4a that define the position of the semiconductor chip relative to the circuit substrate 2 in the direction perpendicular to the surface.

In the embodiment shown in FIG. 4, a positioning element 4a is formed at each corner of the semiconductor chip 1. Alternatively, the positioning element 4a may extend along the entire periphery of the semiconductor chip, or may be provided on the surface of the semiconductor chip itself.

Alternatively or additionally, positioning elements can be formed on the circuit substrate 2. In the embodiment shown in FIG. 4, the positioning elements 4b are formed on the surface of the circuit substrate 2 and engage with the positioning element 4a to define the position of the semiconductor chip 1 relative to the circuit substrate in the direction parallel to the surface of the circuit substrate. Thus, the positioning elements 4a not only define the position of the semiconductor chip relative to the circuit substrate in the direction perpendicular to the surface of the circuit substrate but also define the position of the semiconductor chip relative to the circuit substrate in the direction parallel to the surface of the circuit substrate.

The electronic circuit 13 can send signals to and receive signals from electronic circuits on the circuit substrate 2 through the conductive needle 31 at the tip of the cantilever 3 and terminal pad 21 connected thereto, so that the electronic circuit 13 can be coupled to other semiconductor chips mounted on the circuit substrate 2.

In the embodiment shown in FIG. 4, the cantilevers 3 are formed on all four sides surrounding the semiconductor chip 1, but the positions of the cantilevers are not limited to this arrangement. For example, cantilevers can be formed only on two sides of the semiconductor chip. Or cantilevers can be formed at any location on the entire surface of the semiconductor chip. Additionally, cantilevers can be positioned without being limited to a row or lattice arrangement.

In the examples described above, the terminal pad 21 is contacted by single conductive needle 31 located at the end of the cantilever 3. However, for connections for large currents, such as power supply connections or ground connections, multiple conductive needles may be provided at the end of the cantilever. In this case, the multiple conductive needles simultaneously contact the terminal pad. Alternatively, the terminal pad may be simultaneously contacted by multiple conductive needles mounted on two or more cantilevers. Increasing number of conductive needles contacting the terminal pad reduces the current flowing through each conductive needle, and avoids excess current levels that could damage the conductive needle or the terminal pad.

A circuit can also be provided to diminish the effect of any contact resistance in the contact between the conductive needle 31 and the terminal pad 21 on the connections in the signal system, excluding the power supply connections and the ground connections. For example, a buffer amplifier having a high input impedance may be provided on the downstream side of the contact, and a buffer amplifier having a low output impedance may be provided on upstream side of the contact. This reduces the current flowing through the contact between the conductive needle and the terminal pad. As a result, an electrical connection structure can be implemented that prevents signal losses due to contact resistance in the contact between the conductive needle and the terminal pad connection and prevents changes in the signal amplitude due to fluctuations in the contact resistance.

Figure 5:
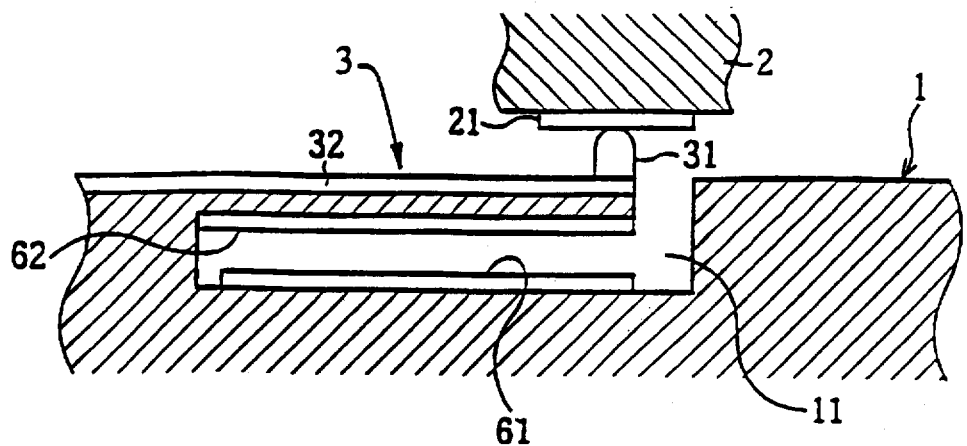
FIG. 5 is an enlarged cross sectional view showing a second embodiment of the electrical connection structure according to the present invention.

FIG. 5 is an enlarged cross-sectional view showing a second embodiment of the present invention. The semiconductor chip 1 in the embodiment shown in FIG. 5 is equipped with the attraction electrode 61 for electrostatically driving the cantilever 3. The attraction electrode is located at the bottom of the trench 11. The semiconductor chip is also equipped with the electrostatic drive electrode 62 formed on the back of the cantilever 3. A voltage applied by a control circuit (not shown) between the attraction electrode 61 and the electrostatic drive electrode 62 causes an electrostatic force to be exerted between the electrodes. The electrostatic force attracts the cantilever towards the attraction electrode. Therefore, the magnitude of the contact force between the conductive needle 31 and the terminal pad 21 can be controlled electrically.

Normally, when multiple electrical connections are made between the semiconductor chip 1 and the circuit substrate 2, such problems as poor parallelism and flatness of the two facing surfaces can cause the contact force to be different at each connection. This non-uniformity in the contact force arises because of non-uniformity in the height of the conductive needle 31 relative to the height of the terminal pad. Non-uniformity in the contact force can result in non-uniformity in signal levels. However, when the electrical connection structure in the embodiment shown in FIG. 5 is adopted, the contact force between the semiconductor chip 1 and the circuit substrate 2 at each connection can be electrically controlled from outside the module to make the contact force the same at each connection. In the embodiment shown in FIG. 5, a voltage may be applied to the attraction electrode and the electrostatic drive electrode to weaken the contact force at the connections at which the contact force is too large. This avoids the non-uniformity problems mentioned above.

Furthermore, switching operations can be performed to freely open and close the connections from outside the module. After building the module, unneeded signal connections can be disconnected. For example, when the MCM operation is checked before being shipped from the factory or after the MCM is mounted in an electronic device, special switches are not required in the test equipment. Instead, the electrically-actuated contacts in the MCM can be used to switch on and off the connections to one semiconductor chip, the connections to one group of chips, one connection, or one group of connections.

When the operation of the MCM is checked as just described, since the special switches are not needed in the test equipment, or fewer special switches are needed, the size and complexity of the test equipment can be reduced, energy can be saved, and costs can be reduced.

Figure 6:
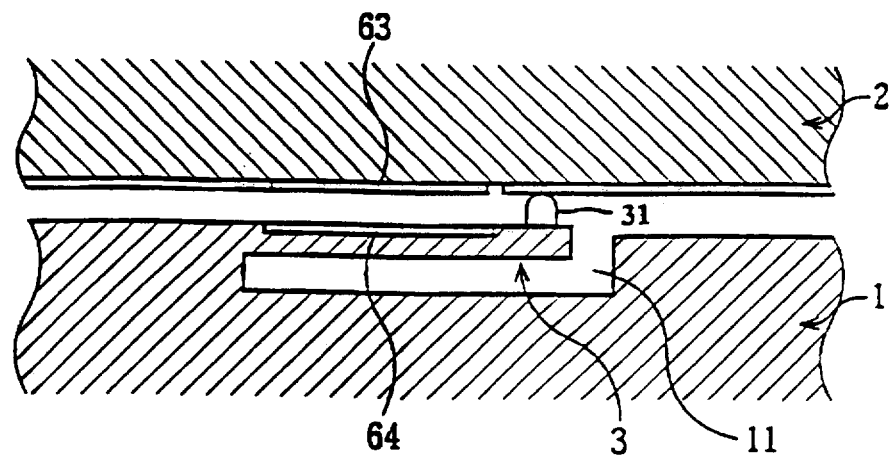
FIG. 6 is an enlarged cross sectional view showing a third embodiment of the electrical connection structure according to the present invention.

FIG. 6 is an enlarged cross-sectional view showing a third embodiment of the present invention. In contrast to the embodiment shown in FIG. 5, in the embodiment shown in FIG. 6, the attraction electrode 63 for the electrostatic drive is located on the circuit substrate 2 and the electrostatic drive electrode 64 is formed on the front surface of the cantilever 3. A voltage applied by a control circuit (not shown) between the attraction electrode 63 and the electrostatic drive electrode 64 attracts the cantilever towards the circuit substrate to increase the contact force. In the embodiment shown FIG. 6, the trace connected to the conductive needle 31 is not shown.

The embodiment shown in FIG. 6 is simpler than that shown in FIG. 5, because the attraction electrode 63 is located on the circuit substrate 2. This saves having to provide an electrical connection structure to supply the control signal to the attraction electrode 61 on the semiconductor chip 1.

Figure 7:
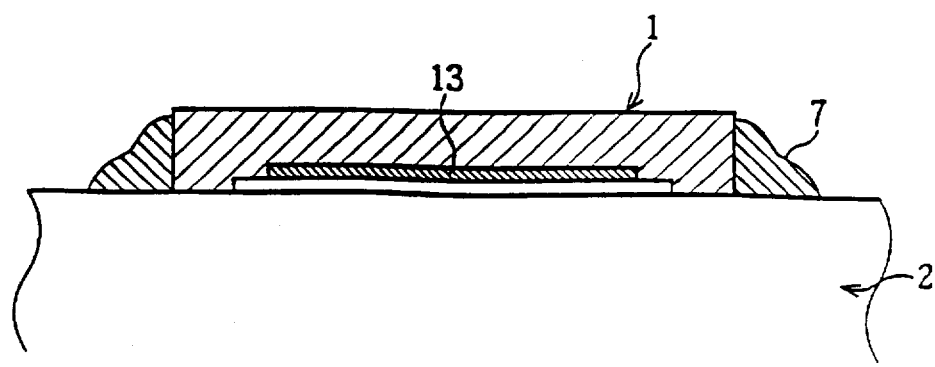
FIG. 7 is an enlarged cross sectional view showing a first example of a fixing element holding the semiconductor chip juxtaposed to the circuit substrate in the electrical connection structure according to present invention.

FIG. 7 shows an example of how the semiconductor chip 1 can be fixed to the surface of the circuit substrate 2 in an MCM. The semiconductor chip 1 is surrounded by an epoxy or silicone adhesive 7, and the semiconductor chip and circuit substrate are pressed together while the adhesive hardens. If the electronic circuit 13 is formed in the surface of the semiconductor chip facing the circuit substrate, and the adhesive completely surrounds the semiconductor chip, the electronic circuit is protected by an airtight seal.

Figure 8:
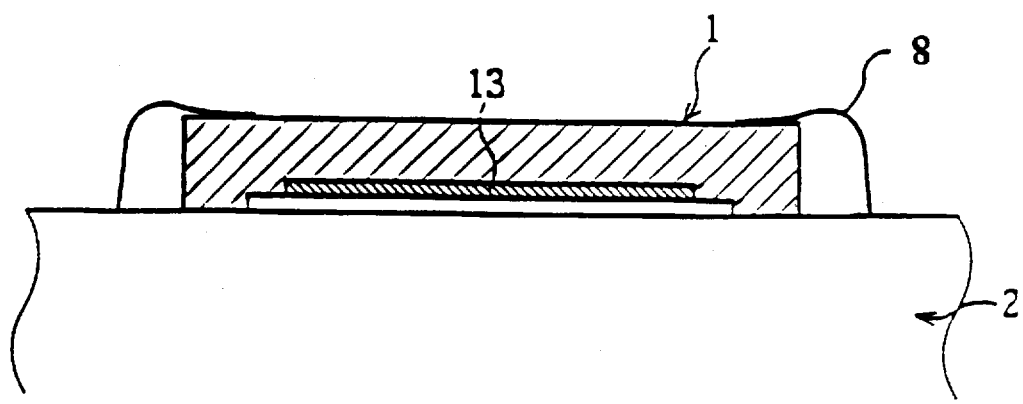
FIG. 8 is an enlarged cross sectional view showing a second example of a fixing element holding the semiconductor chip juxtaposed to the circuit substrate in the electrical connection structure according to present invention.

FIG. 8 shows an alternative way of fixing the semiconductor chip 1 to the circuit substrate 2. In this, at least one resilient strip, such as the resilient strip 8, is used to press the semiconductor chip into contact with the circuit substrate. The resilient strip is a strip of springy metal, plastic, or some other suitable material. The resilient strip is shown in FIG. 8 attached to the circuit substrate. The resilient strip may alternatively be attached to the semiconductor chip, and may engage in slots formed in the circuit substrate.

The resilient strip can be made so that it can easily be released, which allows the semiconductor chip to be easily removed from and replaced in the circuit subtrate. The resilient strip may be used exclusively to fix the semiconductor chip to the circuit substrate. Alternatively, the resilient strip may be used to fix the semiconductor chip to the substrate temporarily during assembly and testing, and may be supplemented or replaced by an adhesive when testing shows that the module is operating correctly.

The electrical connection structure according to present invention has the following effects.

(1) The electrical connection structure connects a pair of circuit members, particularly a pair of circuit members having minute terminals with a narrow pitch, without using solder.

(2) Since soldering is not required in the electrical connection structure, no heating is required, so the electrical connection structure is ideal for connecting semiconductor devices, such as CCD imaging devices, that cannot tolerate high temperatures.

(3) Since the conductive needle in the electrical connection structure can slide while in contact with the surface of the terminal pad, the thermal expansion coefficients of the circuit members do not always have to match. Consequently, the electrical connection structure will provide highly reliable connections when applied to a wide range of substrates. Furthermore, when the circuit members are fixed to one another by an adhesive, even if temperature changes cause small amounts of relative motion between the circuit members, the conductive needle will slide across the surface of the terminal pad and will maintain the contact. Problems such as mechanical or electrical degradation in the connections due to heat are avoided.

(4) The electrical connection structure according to the present invention can be used to provide temporary electrical connections between the circuit members. This enables an MCM to be repaired by replacing a bad semiconductor chip, and results in an significantly increased yield. In addition, since removing semiconductor chips from and mounting them on the circuit substrate are simple, using the electrical connection structure according to the present invention can decrease the cost of testing significantly because replacing bad elements can be done quickly.

Although this disclosure describes illustrative embodiments of the invention in detail, it is to be understood that the invention is not limited to the precise embodiments described, and that various modifications may be practiced within the scope of the invention defined by the appended claims.

We claim:

1. An electrical connection structure for connecting a first circuit member to a second circuit member, the first circuit member including a semiconductor substrate, the electrical connection structure comprising:

a cantilever formed in the semiconductor substrate, the cantilever having an end remote from the semiconductor substrate;

a conductive needle at the end of the cantilever, the conductive needle being electrically connected to the first circuit member;

a terminal pad located on the second circuit member opposite the conductive needle when the first circuit member and the second circuit member are juxtaposed, the terminal pad being electrically connected to the second circuit member; and fixing means for fixing the first circuit member juxtaposed to the second circuit member in a way that stresses the cantilever to apply a contact force between the conductive needle and the terminal pad.

2. The electrical connection structure of claim 1, in which:

the second circuit member is a circuit substrate;

the first circuit member is one of plural semiconductor chips;

each of the semiconductor chips includes a semiconductor substrate in which a cantilever is formed; and the electrical connection structure additionally includes a terminal pad located on the second circuit member opposite the conductive needle of the cantilever in each of the semiconductor chips.

3. The electrical connection structure of claim 2, in which the substrate of the first circuit member includes single-crystal silicon, and the cantilever is formed in the substrate by silicon micro machining.

4. The electrical connection structure of claim 1, additionally comprising electrostatic electrode means, attached to the cantilever and at least one of the first circuit member and the second circuit member, for applying flexural stress to the cantilever.

5. The electrical connection structure of claim 4, additionally comprising control means for applying a voltage to the electrostatic drive electrode means to change the contact force between the conductive needle and the terminal pad.

6. The electrical connection structure of claim 5, in which the control means is additionally for applying a voltage to the electrostatic drive electrode means to break contact between the conductive needle and the terminal pad.

7. The electrical connection structure of claim 4, in which the substrate of the first circuit member includes single-crystal silicon, and the cantilever is formed in the substrate by silicon micro machining.

8. The electrical connection structure of claim 4, additionally comprising plural conductive needles contacting the terminal pad, the plural conductive needles being located at the end of at least one cantilever.

9. The electrical connection structure of claim 4, in which:

the first circuit member and the second circuit member are generally planar; and electrical connection structure additionally comprises positioning means, located on at least one of the first circuit member and the second circuit member, for defining a relative positioning between the first circuit member and the second circuit member at least in a direction perpendicular to the plane of the circuit members.

10. The electrical connection structure of claim 4, in which the fixing means is for temporarily holding the first circuit member juxtaposed to the second circuit member to allow the first circuit member to be removed from and re-installed in the second circuit member.

11. The electrical connection structure of claim 1, in which the substrate of the first circuit member includes single-crystal silicon, and the cantilever is formed in the substrate by silicon micro machining.

12. The electrical connection structure of claim 1, additionally comprising plural conductive needles contacting the terminal pad, the plural conductive needles being located at the end of at least one cantilever.

13. The electrical connection structure of claim 12, in which the substrate of the first circuit member includes single-crystal silicon, and the cantilever is formed in the substrate by silicon micro machining.

14. The electrical connection structure of claim 1, in which the electrical connection structure additionally comprises positioning means, located on at least one of the first circuit member and the second circuit member, for defining a relative positioning between the first circuit member and the second circuit member at least in a direction perpendicular to the substrate of the first circuit member.

15. The electrical connection structure of claim 14, in which the substrate of the first circuit member includes single-crystal silicon, and the cantilever is formed in the substrate by silicon micro machining.

16. The electrical connection structure of claim 1, in which the fixing means is for temporarily holding the first circuit member juxtaposed to the second circuit member to allow the first circuit member to be removed from and re-installed in the second circuit member.

17. The electrical connection structure of claim 16, in which the substrate of the first circuit member includes single-crystal silicon, and the cantilever is formed in the substrate by silicon micro machining.

18. An electrical connection structure for connecting a first circuit member to a second circuit member, the electrical connection structure comprising:

a single-crystal substrate in the first circuit member;

a cantilever formed from the single-crystal substrate of the first circuit member by micromachining, the cantilever having an end remote from the semiconductor substrate;

a conductive needle at the end of the cantilever, the conductive needle being electrically connected to the first circuit member;

a terminal pad located on the second circuit member opposite the conductive needle when the first circuit member and the second circuit member are juxtaposed, the terminal pad being electrically connected to the second circuit member;

positioning means, located on at least one of the first circuit member and the second circuit member, for defining a relative positioning between the first circuit member and the second circuit member a direction perpendicular to the substrate of the first circuit member; and fixing means for fixing the first circuit member juxtaposed to the second circuit member in a way that stresses the cantilever to apply a contact force between the conductive needle and the terminal pad.

19. The electrical connection structure of claim 18, in which the positioning means is additionally for defining the relative positioning between the first circuit member and the second circuit member a direction parallel to the substrate of the first circuit member.

20. An electrical connection structure for connecting a first circuit member to a second circuit member, the electrical connection structure comprising:

a single-crystal substrate in the first circuit member;

a cantilever formed in the single-crystal substrate of the first circuit member, the cantilever having an end remote from the semiconductor substrate;

a conductive needle at the end of the cantilever, the conductive needle being electrically connected to the first circuit member;

a terminal pad located on the second circuit member opposite the conductive needle when the first circuit member and the second circuit member are juxtaposed, the terminal pad being electrically connected to the second circuit member;

fixing means for fixing the first circuit member juxtaposed to the second circuit member in a way that stresses the cantilever to apply a contact force between the conductive needle and the terminal pad, and electrostatic electrode means, attached to the cantilever and at least one of the first circuit member and the second circuit member, for applying flexural stress to the cantilever in response to a voltage.

* * * * *